(12) United States Patent
Wakaba et al.

(10) Patent No.: US 12,308,616 B2
(45) Date of Patent: May 20, 2025

(54) SEMICONDUCTOR DEVICE

(71) Applicant: FURUKAWA ELECTRIC CO., LTD., Tokyo (JP)

(72) Inventors: Masaki Wakaba, Tokyo (JP); Yasutaka Higa, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 774 days.

(21) Appl. No.: 17/392,878

(22) Filed: Aug. 3, 2021

(65) Prior Publication Data

US 2021/0367405 A1 Nov. 25, 2021

Related U.S. Application Data

(63) Continuation of application No. PCT/JP2020/004099, filed on Feb. 4, 2020.

(30) Foreign Application Priority Data

Feb. 8, 2019 (JP) ................. 2019-021914

(51) Int. Cl.
*H01S 5/227* (2006.01)
*H01S 5/024* (2006.01)
(Continued)

(52) U.S. Cl.
CPC .......... *H01S 5/227* (2013.01); *H01S 5/02453* (2013.01); *H01S 5/026* (2013.01); *H01S 5/2213* (2013.01); *H01S 2304/04* (2013.01)

(58) Field of Classification Search
CPC ..................................................... H01S 5/227
See application file for complete search history.

(56) References Cited

U.S. PATENT DOCUMENTS

| 2009/0154514 A1* | 6/2009 | Oh ............................. H01S 5/50 |
| | | 372/45.011 |
| 2013/0182733 A1* | 7/2013 | Yoneda ..................... H01S 5/22 |
| | | 372/44.01 |

(Continued)

FOREIGN PATENT DOCUMENTS

| CN | 1756010 A | 4/2006 |
| JP | 2012-174938 A | 9/2012 |

(Continued)

OTHER PUBLICATIONS

English Translation of Hasegawa (Year: 2016).*

(Continued)

*Primary Examiner* — Xinning (Tom) Niu
*Assistant Examiner* — Stephen Sutton Kotter
(74) *Attorney, Agent, or Firm* — Oblon, McClelland, Maier & Neustadt, L.L.P.

(57) ABSTRACT

A semiconductor device includes: a mesa portion that has a semiconductor layered structure, and that extends in a predetermined direction; an extending portion that extends along the mesa portion and that is separated by trench grooves arranged respectively on both sides of the mesa portion; insulating portions that are made from an insulating material, and are arranged in the respective trench grooves; and a conductive portion that is arranged on an upper side of the mesa portion. Further, at least one of the insulating portions adheres intimately to the mesa portion, and forms a gap between the at least one of the insulating portions and the extending portion in at least a part of an extending direction of the mesa portion, and the conductive portion is arranged across at least one of the insulating portions and the mesa portion.

10 Claims, 3 Drawing Sheets

(51) Int. Cl.
*H01S 5/026* (2006.01)
*H01S 5/22* (2006.01)

(56) References Cited

U.S. PATENT DOCUMENTS

| | | |
|---|---|---|
| 2015/0331298 A1 | 11/2015 | Yagi |
| 2016/0111856 A1* | 4/2016 | Yan .................. H01S 5/3211 372/34 |
| 2016/0377953 A1 | 12/2016 | Feng et al. |
| 2018/0335569 A1 | 11/2018 | Saito et al. |
| 2019/0363516 A1 | 11/2019 | Higa et al. |

FOREIGN PATENT DOCUMENTS

| | | |
|---|---|---|
| JP | 2015-12176 A | 1/2015 |
| JP | 2015-197642 A | 11/2015 |
| JP | 2015-216318 A | 12/2015 |
| JP | 2016-54168 A | 4/2016 |
| JP | 2016054168 A * | 4/2016 |
| WO | WO 2016/154372 A1 | 9/2016 |
| WO | WO 2017/135436 A1 | 8/2017 |
| WO | WO 2018/147307 A1 | 8/2018 |

OTHER PUBLICATIONS

Combined Chinese Office Action and Search Report issued Jul. 21, 2023 in Chinese Patent Application No. 202080012827.8, (with unedited computer-generated English translation), citing document 15 therein, 11 pages.

International Search Report issued Apr. 21, 2020 in PCT/JP2020/004099, filed on Feb. 4, 2020 citing documents AB-AC, AP-AV & AY therein, 3 pages.

Tanaka, "Self Oscillation Semiconductor Laser System", Published technical information of Japan Institute of Invention and Innovation, Sep. 8, 2006, 8 pages (with English Translation).

* cited by examiner

SEMICONDUCTOR DEVICE

CROSS-REFERENCE TO RELATED APPLICATION(S)

This application is a continuation of International Application No. PCT/JP2020/004099, filed on Feb. 4, 2020 which claims the benefit of priority of the prior Japanese Patent Application No. 2019-021914, filed on Feb. 8, 2019, the entire contents of which are incorporated herein by reference.

BACKGROUND

The present disclosure relates to a semiconductor device.

A structure including a mesa portion that extends in a predetermined direction, and extending portions that extend along the mesa portion separated by trench grooves arranged respectively at both sides of the mesa portion as a semiconductor device has been disclosed (for example, Japanese Laid-open Patent Publication No. 2016-054168). The mesa portion has a semiconductor layered structure having an optical waveguide region. On an upper side of the mesa portion, a heater made from a metal is arranged. Moreover, Japanese Laid-open Patent Publication No. 2016-054168 discloses that an insulator, such as resin, may be filled in the trench groove.

SUMMARY

There is a need for providing a semiconductor device in which characteristic change or decrease in reliability can be suppressed.

According to an embodiment, a semiconductor device includes: a mesa portion that has a semiconductor layered structure, and that extends in a predetermined direction; an extending portion that extends along the mesa portion and that is separated by trench grooves arranged respectively on both sides of the mesa portion; insulating portions that are made from an insulating material, and are arranged in the respective trench grooves; and a conductive portion that is arranged on an upper side of the mesa portion. Further, at least one of the insulating portions adheres intimately to the mesa portion, and forms a gap between the at least one of the insulating portions and the extending portion in at least a part of an extending direction of the mesa portion, and the conductive portion is arranged across at least one of the insulating portions and the mesa portion.

DETAILED DESCRIPTION

In the related art, there is a case in which the heater does not fit within a width of the mesa portion for designing reason and manufacturing precision reason or the like, and is arranged across the insulator from the mesa portion. In such a case, due to a difference among thermal expansion coefficients of the mesa portion, the heater, and the insulator, variations in temperature in the manufacturing process of a semiconductor device, or variations in environmental temperature after manufacturing of the semiconductor device can produce cracks in the heater. Cracks in the heater can cause deterioration in characteristics (resistivity and the like) of the heater, deterioration in characteristics or decrease in credibility of the semiconductor device. The same problem can occur also when an electrode is arranged across the insulator from the mesa portion. Such an electrode is arranged to supply an electric current, for example, to the mesa portion. Particularly, when the width of the mesa portion is narrow, the heater or the electrode do not fit within the width of the mesa portion more often.

Hereinafter, embodiments of the present disclosure will be explained with reference to the accompanying drawings. The embodiments explained in the following are not intended to limit the present disclosure. Moreover, common reference signs are assigned appropriately to identical or corresponding components in description throughout the drawings, and duplicated explanation will be appropriately omitted. Furthermore, it is noted that the drawings show schematic illustrations, and a relationship among dimensions of respective components, a ratio among the respective components, and the like differ from those in actual situations.

First Embodiment

Figure 1:
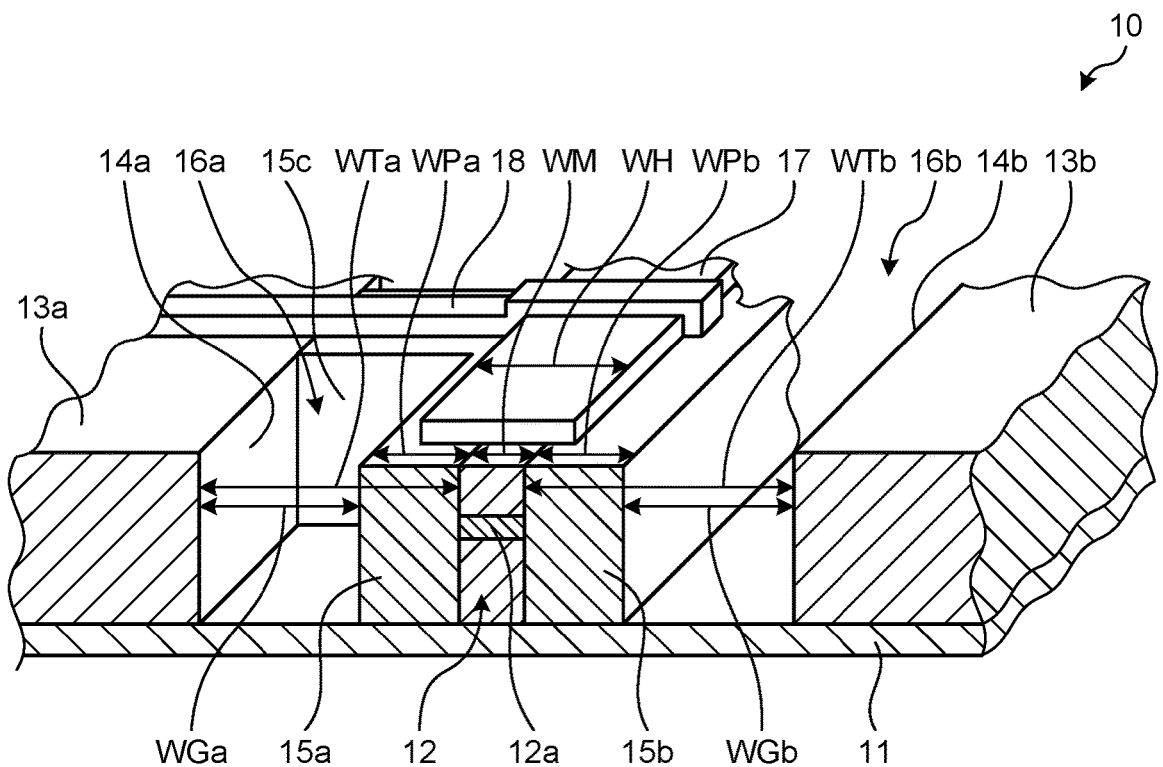
FIG. 1 is a schematic diagram of a semiconductor device according to a first embodiment.

FIG. 1 is a schematic diagram of a semiconductor device according to a first embodiment. This semiconductor device 10 includes a substrate 11, a mesa portion 12, and extending portions 13a, 13b.

The substrate 11 is a semiconductor substrate, and is made from, for example, n-type indium phosphide (InP). The mesa portion 12 is arranged on a surface of the substrate 11 in a standing manner, and extends in a predetermined direction along the surface of the substrate 11. A width perpendicular to the extending direction of the mesa portion 12 is denoted as a mesa width WM. The mesa width WM is, for example, about 1 µm to 2 µm. A length in the extending direction of the mesa portion 12 is, for example, 50 µm to 1000 µm.

The mesa portion 12 has a semiconductor layered structure. Specifically, the mesa portion 12 has an optical waveguide layer 12a that is an optical waveguide region. The optical waveguide layer 12a is made from, for example, InGaAsP having a refractive index higher than InP. A portion of the mesa portion 12 closer to the substrate 11 relative to the optical waveguide layer 12a is made from, for example, n-type InP, and structures a cladding region with respect to the optical waveguide layer 12a. A portion of the mesa portion 12 on the opposite side to the substrate 11 relative to the optical waveguide layer 12a (hereinafter, denoted as upper side, appropriately) is made from, for example, p-type InP, and structures a cladding region with respect to the optical waveguide layer 12a. The mesa portion 12 guides light with a layered structure with the optical waveguide region and the cladding region. Note that InP and InGaAsP are used to guide light having a wavelength of 1.55 µm band. When light of another wavelength band is guided, a semiconductor material suitable for the wavelength may be used appropriately.

The extending portions 13a, 13b extend along the mesa portion 12, separated by the trench grooves 14a, 14b having a width of 15 μm or more respectively arranged at both sides in the width direction of the mesa portion 12. The extending portions 13a, 13b have a semiconductor layered structure same as that of the mesa portion 12. However, the extending portions 13a, 13b may have a different semiconductor layered structure, or may be constituted of a material other than semiconductor, for example, an insulator. Moreover, a height of the extending portions 13a, 13b is substantially the same as the height of the mesa portion 12 relative to the surface of the substrate 11, but it may be different therefrom. On the mesa portion 12 and the extending portions 13a, 13b, a protection film made from, for example, a dielectric material may be formed. Widths of the trench grooves 14a, 14b are WTa, WTb, respectively. In the present embodiment, the widths WTa, WTb are uniform, but may be different from each other.

The semiconductor device 10 further includes an insulating portions 15a, 15b. The insulating portions 15a, 15b are made from an insulating material, for example, polyimide.

The insulating portion 15a is arranged at the trench groove 14a, and adheres intimately to the mesa portion 12. Moreover, the insulating portion 15a forms a gap 16a between itself and the extending portion 13a at a part in the extending direction of the mesa portion 12. A width of the insulating portion 15a is a width WPa. A width of the gap 16a is a width WGa. An insulating portion 15c is a part of the insulating portion 15a, and it extends from the insulating portion 15a to adhere intimately to the extending portion 13a. That is, the insulating portion 15c structures a portion of the insulating portion 15a in which the gap 16a is not formed between itself and the extending portion 13a.

The insulating portion 15b is arranged at the trench groove 14b, and adheres intimately to the mesa portion 12. Moreover, the insulating portion 15b forms a gap 16b between itself and the extending portion 13b entirely in the extending direction of the mesa portion 12. A width of the insulating portion 15b is a width WPb. A width of the gap 16b is a width WGb. In the present embodiment, the widths WPa, WPb are uniform, and the widths WGa, WGb are uniform, but they may be different from each other.

The semiconductor device 10 further includes a heater 17 that is a conductive portion. The heater 17 is arranged on the upper side of the mesa portion 12, and extends in the extending direction of the mesa portion 12. The heater 17 is arranged across both the mesa portion 12 and the insulating portions 15a, 15b. A width of the heater 17 is a width NH. A value of the width NH is larger than a value of the width NM, which is the mesa width. The heater 17 is made from an alloy, principal components of which are nickel (Ni) and chrome (Cr), but it is not particularly limited as long as it is a conductive material usable for a heater. A thermal expansion coefficient of the conductive material forming the heater 17 is smaller than the thermal expansion coefficient of the insulating material forming the insulating portions 15a, 15b. Note that a protection film made from, for example, a dielectric material may be formed between the heater 17 and the insulating portions 15a, 15b.

Moreover, an end of the heater 17 on a side lying over the insulating portion 15a is positioned closer to the mesa portion 12 than from the end of the insulating portion 15a (end on a side closer to the gap 16a). Similarly, an end of the heater 17 on a side lying over the insulating portion 15b is positioned closer to the mesa portion 12 than from the end of the insulating portion 15b (end on a side closer to the gap 16b). Therefore, the heater 17 does not stick out from the insulating portions 15a, 15b, and is supported by the mesa portion 12 and the insulating portions 15a, 15b as its base.

The semiconductor device 10 further includes a wiring portion 18. The wiring portion 18 is made mainly from, for example, gold (Au), and is laid from the extending portion 13a to reach the heater 17 through the insulating portions 15a, 15c, to be electrically connected to the heater 17. Furthermore, in the semiconductor device 10, a not illustrated insulating portion similar to the insulating portion 15c and a not illustrated wiring portion similar to the wiring portion 18 are arranged at a position separated from the insulating portion 15c in the extending direction of the mesa portion 12. The heater 17 is supplied with an electric current by the wiring portion 18 and the not illustrated wiring portion, to generate heat. Thus, the optical waveguide layer 12a is heated to change the refractive index, an optical path length of the optical waveguide layer 12a changes. Therefore, by controlling an amount of electric current to be supplied to the heater 17, the optical path length of the optical waveguide layer 12a can be controlled. The insulating portion 15c is only necessary to have the width in the extending direction of the mesa portion 12 as large as to be able to arrange the wiring portion 18.

The insulating portions 15a, 15b expands and contracts with temperature change in the manufacturing process of the semiconductor device 10, changes of environmental temperature after manufacturing of the semiconductor device 10, and the like. At this time, because the gap 16a is formed between the insulating portion 15a and the extending portion 13a, and the gap 16b is formed between the insulating portion 15b and the extending portion 13b, a stress generated in the insulating portions 15a, 15b is suppressed. As a result, a stress on the heater 17 is also suppressed, and cracks of the heater 17 are suppressed. Thus, deterioration of characteristics or decrease in credibility of the semiconductor device 10 can be suppressed.

Figure 2:
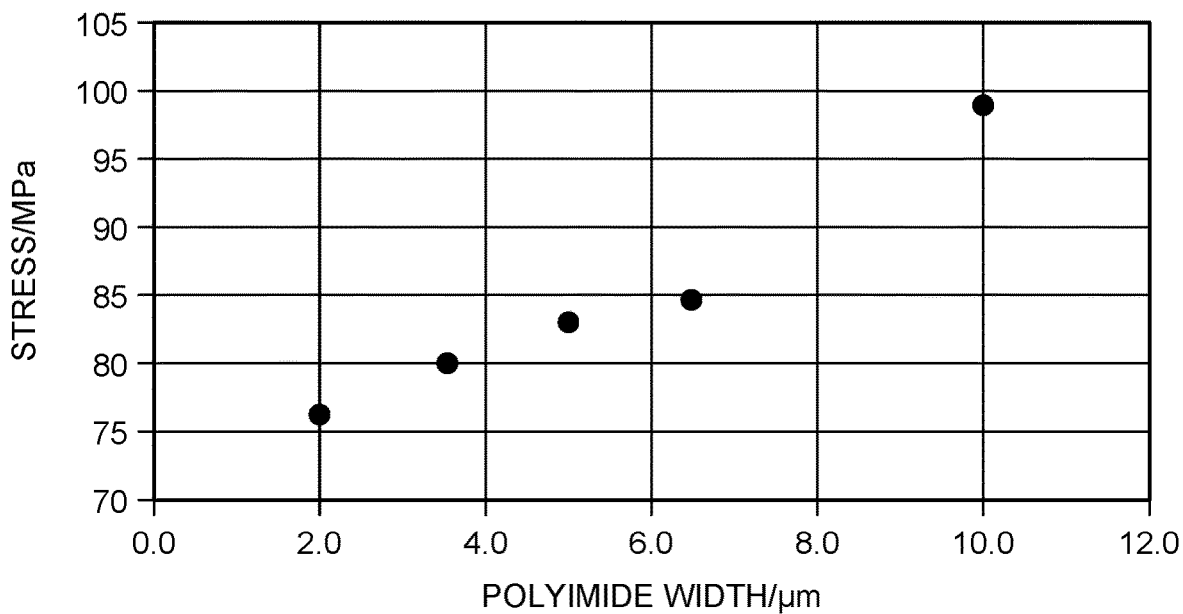
FIG. 2 is a diagram illustrating a relationship between a polyimide width or a gap width and a stress generated in polyimide.

Next, in the structure of the semiconductor device 10, a stress caused on the heater 17 was calculated by a coupled analysis calculation in which a heat and a stress are calculated at the same time by using the finite element method. FIG. 2 is a diagram illustrating a relationship between the polyimide width WPa, WPb or widths WGa, WGb of the gaps 16a, 16b and a maximum stress generated in the heater 17 when the insulating portions 15a, 15b are polymer having the thermal expansion coefficient of 36 ppm/K, and the heater is a metal having the thermal expansion coefficient of 18 ppm/K. The widths WPa, WPb are the same value. The widths WGa, WGb are the same value. The widths WTa, WTb of the trench grooves 14a, 14b are both 10 μm.

As shown in FIG. 2, when the polyimide width is 10 μm, that is, when the gap width is 0 μm, the stress was 99 MPa, but as the polyimide width was decreased and the gap width was increased, the stress decreased, and it decreased up to 80 MPa with the polyimide width of 3.5 μm. In an experiment conducted under various conditions by the inventors of the present disclosure, it was found that the gap width is preferable to be 80% of the trench groove width or smaller. Moreover, when the trench groove width is 10 μm, the gap width is preferable to be 2 μm or larger.

As explained above, the semiconductor device 10 according to the first embodiment is a device in which deterioration of characteristics or decrease in credibility is suppressed.

The semiconductor device 10 can be manufactured, for example, as follows. First, on the surface of the substrate 11, a semiconductor layered structure same as the mesa portion 12 is formed by the metal-organic chemical vapor deposition (MOCVD) method, and a protection film is formed by the CVD method. Subsequently, the trench grooves 14a, 14b are formed in the semiconductor layered structure by using a photolithography technique and an etching technique. Thus, the mesa portion 12 and the extending portions 13a, 13b are formed. After removing the protection film as necessary, a protection film is subsequently formed by the CVD method, and an insulating material to be the insulating portions 15a, 15b is then applied by the spin coat technique. Subsequently, a part of the insulating material is removed by using the photolithography technique and the etching technique, to form the insulating portions 15a, 15b, and the gaps 16a, 16b. Subsequently, after forming the protection film by the CVD method, the heater 17 and the wiring portion 18 are formed by using the metal vapor deposition method and the liftoff technique. Thereafter, by performing necessary processing, the semiconductor device 10 is completed.

Second Embodiment

Figure 3:
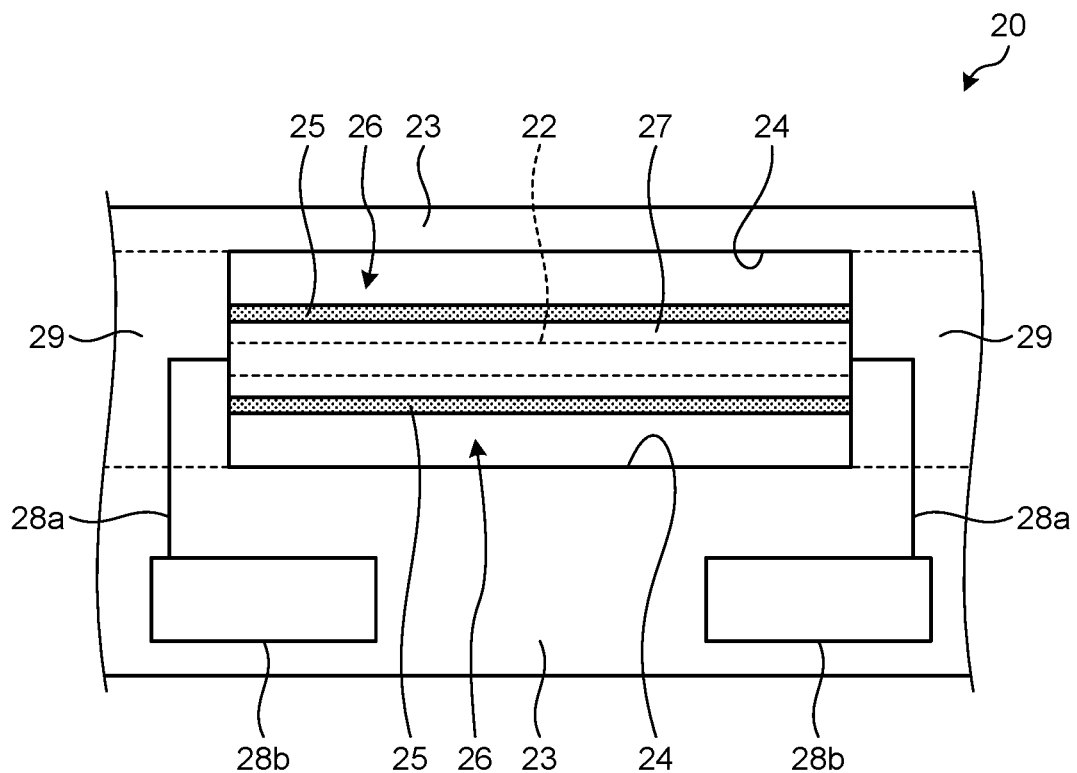
FIG. 3 is a schematic diagram of a semiconductor device according to a second embodiment.
Figure 4:
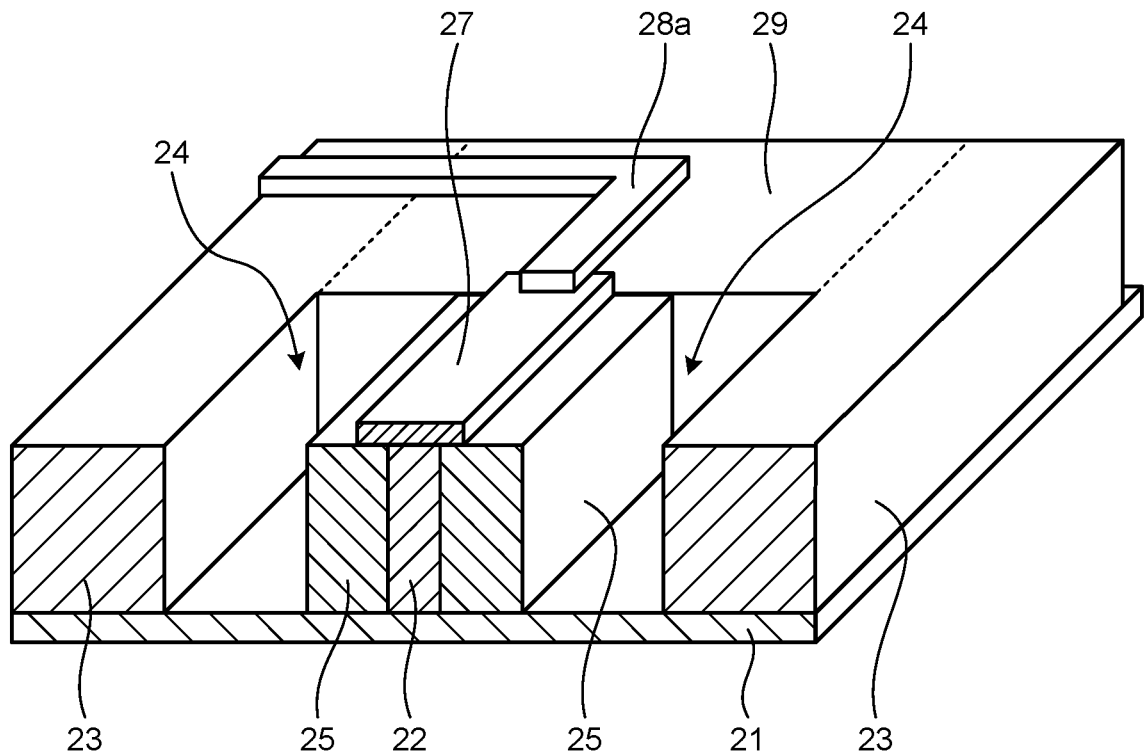
FIG. 4 is a schematic diagram of a semiconductor device according to the second embodiment.

FIG. 3 is a schematic diagram of a semiconductor device according to a second embodiment, and illustrates a top view of the semiconductor device. FIG. 4 is a schematic diagram of the semiconductor device according to a second embodiment, and illustrates a cross-sectional perspective view of the semiconductor device. This semiconductor device 20 includes a substrate 21, a mesa portion 22, two extending portions 23, two insulating portion 25, a heater 27, two wiring portions 28a, and two electrode pads 28b, and two connecting portions 29. The extending portions 23 extend along the mesa portion 22 separated by trench grooves 24 arranged respectively at both ends in a width direction of the mesa portion 22. The insulating portions 25 are respectively arranged at the trench grooves 24. The insulating portions 25 respectively adhere intimately to the mesa portion 22, and gaps 26 are formed between themselves and the extending portions 23 entirely in the extending direction of the mesa portion 22. The heater 27 is arranged across the mesa portion 22 and both of the two insulating portions 25.

Because the substrate 21, the mesa portion 22, the extending portions 23, the trench grooves 24, the insulating portions 35, the gaps 26, and the heater 27 can have structures similar to those of the substrate 11, the mesa portion 12, the extending portions 13a, 13b, the trench grooves 14a, 14b, the insulating portion 15a, 15b, the gaps 16a, 16b, and the like that are corresponding portions in the semiconductor device 10, explanation thereof is omitted.

The two connecting portions 29 are arranged so as to be connected to the mesa portion 22, and to the two opposing extending portions 23 at respective end portions in the extending direction of the mesa portion 22. The connecting portions 29 respectively have a semiconductor layered structure same as that of the mesa portion 22 and the extending portions 23. However, the connecting portions 29 may have a semiconductor layered structure different from those of the mesa portion 22 and the extending portions 23, or may be made from a material other than semiconductors, for example, from an insulator. The mesa portion 22, the extending portions 23, and the connecting portions 29 form an inner walls of the trench grooves 24.

The two wiring portions 28a are electrically connected to end portions in the longitudinal direction of the heater 27, respectively, and extend toward one side of the extending portions 23 through the respective connecting portions 29. At this one side of the extending portion 23, two electrode pads 28b are arranged, and the respective electrode pads 28b are electrically connected to the respective wiring portions 28a. The wiring portions 28a and the electrode pads 28b are made mainly from, for example, gold (Au). The heater 27 are supplied with an electric current by the wiring portions 28a and the electrode pads 28b, to generate heat. By controlling an amount of the electric current to be supplied to the heater 27, an optical path length of the optical waveguide layer in the mesa portion 22 can be controlled.

Because the semiconductor device 20 according to the second embodiment has the gaps 26 between the respective insulating portions 25 and the respective extending portions 23, a stress on the heater 27 is suppressed. Consequently, the semiconductor device 20 is to be a device in which deterioration of characteristics or decrease in credibility is suppressed, similarly to the semiconductor device 10. Moreover, in the semiconductor device 20, a portion as the insulating portion 15c in the semiconductor device 10 is not necessary to be provided.

Third Embodiment

Figure 5:
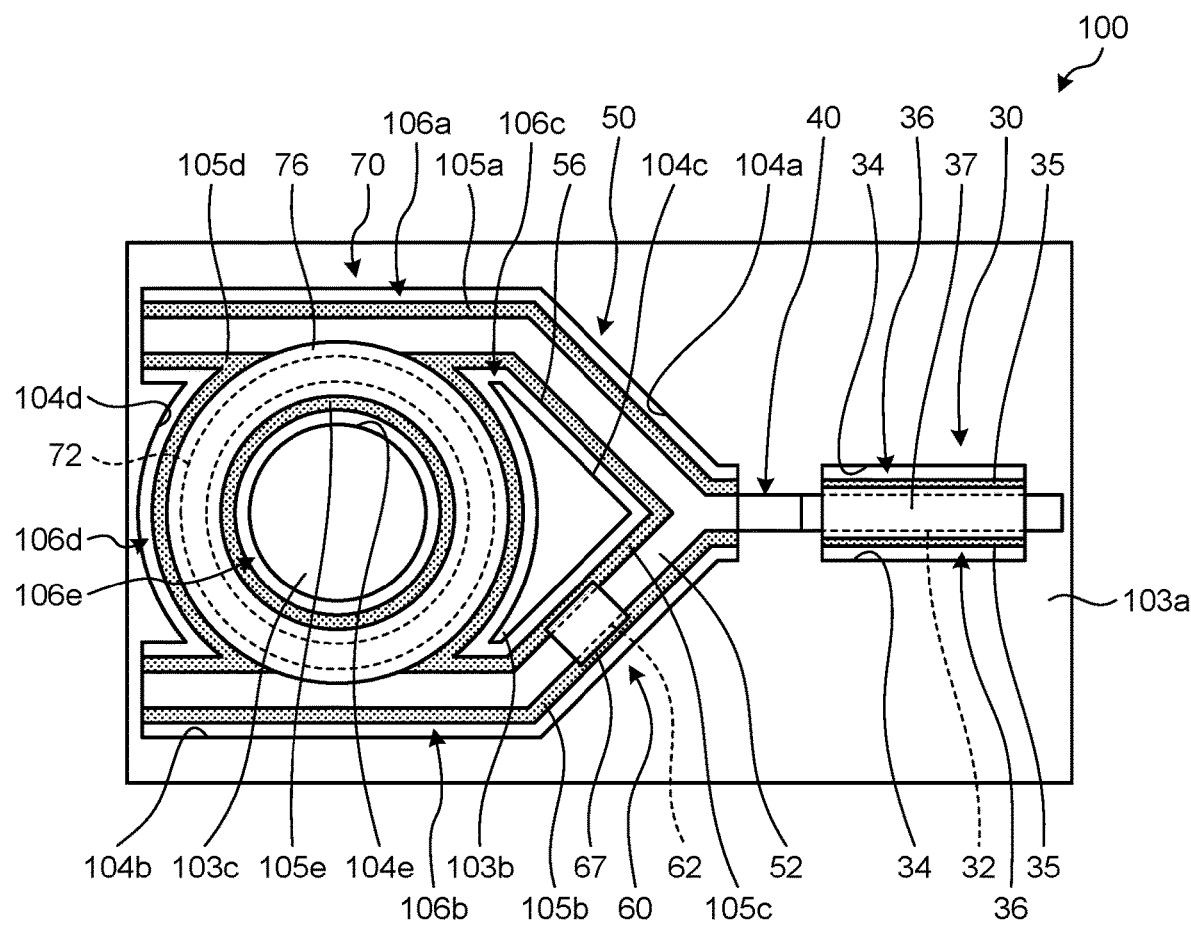
FIG. 5 is a schematic diagram of a semiconductor device according to a third embodiment.

FIG. 5 is a schematic diagram of a semiconductor device according to a third embodiment. This semiconductor device 100 is structured as a wavelength-tunable semiconductor laser device that uses the vernier effect as the one disclosed in international Publication No. WO2018/147307. The semiconductor device 100 includes semiconductor devices 30, 40, 50, 60, 70 that are integrated on a common substrate. In FIG. 5, illustration of respective heaters, electrodes, and wiring portions and electrode pads to supply an electric current to the respective heaters and electrodes is omitted.

The semiconductor device 30 includes a mesa portion 32. The mesa portion 32 has a distributed bragg reflector (DBR) type diffraction grating layer including a sampled grating, and a semiconductor layered structure including an optical waveguide layer. Moreover, the semiconductor device 30 includes an extending portion 103a, two insulating portions 35, and a heater 37. The extending portion 103a has a portion that extends along the mesa portion 32 separated by trench grooves 34 arranged respectively on both sides in a width direction of the mesa portion 32. The insulating portions 35 respectively adhere to the mesa portion 32. In addition, the insulating portions 35 respectively form gaps 36 between themselves and the extending portions 103a entirely in an extending direction of the mesa portion 32. The heater 37 is arranged across the mesa portion 32 and both of the two insulating portions 35.

The semiconductor device 30 has a reflection spectrum characteristic having a comb-shaped peak, and constitutes one of reflectors of a laser resonator. By heating the mesa portion 32 by supplying an electric current to the heater 37, a reflection peak wavelength can be shifted as a whole on a wavelength axis.

The semiconductor device 40 has a buried semiconductor layered structure of a buried mesa type including an active layer as an optical waveguide region. The active layer is optically connected to the optical waveguide layer of the semiconductor device 30, and is supplied with an electric current by a not illustrated electrode provided in the semiconductor device 40.

The semiconductor device 50 includes a mesa portion 52. The mesa portion 52 has a semiconductor layered structure including an optical waveguide layer. The mesa portion 52 is optically connected to an active layer of the semiconductor device 40 at an optical waveguide layer of one of end portions, and extends so as to separate from the semiconductor device 40. The mesa portion 52 branches into two at a multi-mode interference (MMI) portion present in the middle of extension, to form two arm portions, and reaches two end portions on the other side.

The semiconductor device 50 includes extending portions 103a, 103b, and four insulating portions 105a, 105b, 105c, 105d. The extending portions 103a, 103b have a portion extending along the mesa portion 52 separated from trench grooves 104a, 104b, 104c, 104d arranged respectively on both ends in a width direction of the mesa portion 52. The insulating portions 105a, 105b, 105c, 105d are arranged in the trench grooves 104a, 104b, 104c, 104d, respectively. The insulating portions 105a, 105b, 105c, 105d respectively adhere intimately to the mesa portion 52, and form gaps 106a, 106b, 106c, 106d between themselves and the extending portions 103a, 103b in the extending direction of the mesa portion 52.

The semiconductor device 60 constitutes a part of the semiconductor device 50, and includes a mesa portion 62 as a part of one of the arm portions in the mesa portion 52. Moreover, the semiconductor device 60 includes the extending portions 103a, 103b, the two insulating portions 105b, 105c, and a heater 67. The extending portions 103a, 103b have a portion extending along the mesa portion 62 separated by the trench grooves 104b, 104c arranged respectively at both ends in a width direction of the mesa portion 62. The insulating portions 105b, 105c are respectively arranged in the trench grooves 104b, 104c. The insulating portions 105b, 105c respectively adhere intimately to the mesa portion 62, and form the gaps 106b, 106c between themselves and the extending portions 103a, 103b in an extending direction of the mesa portion 62. The heater 67 is arranged across the mesa portion 62 and both of the two insulating portions 105b, 105c.

This semiconductor device 60 can change an optical path length of the optical waveguide layer in the mesa portion 62 by heating the mesa portion 62 by supplying an electric current to the heater 67. Thus, a resonator length of the laser resonator can be changed.

The semiconductor device 70 includes a mesa portion 72. The mesa portion 72 is a ring resonator having a semiconductor layered structure including an optical waveguide layer. In the mesa portion 72, the optical waveguide layer is optically connected to respective optical waveguides in the two arm portions of the mesa portion 52 of the semiconductor device 50. Moreover, the semiconductor device 70 includes the extending portions 103a, 103b, 103c, and three insulating portions 105c, 105d, 105e, and a heater 77. The extending portions 103a, 103b, 103c have a portion extending along the mesa portion 72 separated by the trench grooves 104c, 104d, 104e arranged respectively at both ends in a width direction of the mesa portion 72. The insulating portions 105c, 105d, 105e are respectively arranged in the trench grooves 104c, 104d, 104e. The insulating portions 105c, 105d, 105e respectively adhere intimately to the mesa portion 72, and form the gaps 106c, 106d, 106e between themselves and the respective extending portions 103a, 103b, 103c in an extending direction of the mesa portion 72. The heater 77 is arranged across the mesa portion 72 and both of the two insulating portions 105c, 105e, or across the mesa portion 72 and both of the two insulating portions 105d, 105e.

The semiconductor device 70 has a reflection spectrum characteristic having a comb-shaped peak, a cycle of which differs from that of the semiconductor device 30, and constitutes the other one of the reflectors of the laser resonator. By heating the mesa portion 72 by supplying an electric current to the heater 77, a reflection peak wavelength can be shifted as a whole on a wavelength axis.

As described above, the extending portions 103a, 103b, the trench grooves 104a, 104b, 104c, 104d, the insulating portions 105a, 105b, 105c, 105d, and the gaps 106a, 106b, 106c, 106d function as a common extending portions, trench grooves, insulating portions, and gaps for the semiconductor devices 30, 50, 60, 70.

This semiconductor device 100 functions as a wavelength-tunable laser device that uses the vernier effect by adjusting an electric current to be supplied respectively to the heaters 37, 67, 77.

In the semiconductor device 100 according to the third embodiment, a stress on the heater 37 is suppressed, and deterioration of characteristics and decrease in credibility can be suppressed, similarly to the semiconductor devices 10, 20.

In the embodiment described above, respective insulating portions adhere intimately to a mesa portion, and form gaps between themselves and extending portions at least partially in the extending direction of the mesa portion, and a heater being a conductive portion is arranged across the respective insulating portions and the mesa portion. However, the present disclosure is not limited thereto. It may be configured such that at least one of the insulating portions adheres intimately to the mesa portion, and forms a gap between itself and the extending portion at least in a part in the extending direction of the mesa portion, and that the conductive portion is arranged across at least one of the insulating portions and the mesa portion. Accordingly, it may be structured such that one of the insulating portions adheres intimately to the mesa portion, a gap is formed between itself and the extending portion partially in an extending direction of the mesa portion, and the conductive portion is arranged across the one of the insulating portions and the mesa portion. In this case, a gap is not necessary to be formed between the other one of the insulating portions and the extending portions.

Moreover, although the conductive portion is a heater in the embodiments described above, the conductive portion is not limited to a heater, and may be an electrode to supply an electric current to the mesa portion.

According to an embodiment, an effect that characteristic change or decrease in credibility of a semiconductor device can be suppressed is produced.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor device, comprising:
   a mesa portion that has a semiconductor layered structure, and that extends in a predetermined direction;
   an extending portion that extends along the mesa portion and that is separated by trench grooves arranged respectively on both sides of the mesa portion;
   insulating portions that are made from an insulating material, and are arranged in the respective trench grooves;
   a conductive portion that is arranged on an upper side of the mesa portion, wherein at least one of the insulating portions adheres directly to the mesa portion, and forms a gap between the at least one of the insulating portions and the extending portion in at least a part of an extending direction of the mesa portion, the conductive portion is arranged across at least one of the insulating portions and the mesa portion, and there is a part along the extending direction of the mesa portion where the gap is not formed between the at least one of the insulation portions and the extending portion; and a wiring portion that is laid from the extending portion to reach the conductive portion through the at least one of the insulating portions, that is electrically connected to the conductive portion, and that is positioned on the part over the at least one of the insulation portions and on parts other than the part over the at least one of the insulation portions such that there is no insulation portion on which the wiring portion is not provided.

2. The semiconductor device according to claim 1, wherein
an end of the conductive portion on a side lying over the at least one of the insulating portion is positioned closer to the mesa portion relative to an end of the at least one of the insulating portions.

3. The semiconductor device according to claim 1, wherein
a width of the gap is 2 μm or larger.

4. The semiconductor device according to claim 1, wherein
a width of the gap is 80% of a width of the trench groove or smaller.

5. The semiconductor device according to claim 1, wherein
the mesa portion includes an optical waveguide region.

6. The semiconductor device according to claim 1, wherein
the conductive portion is a heater.

7. The semiconductor device according to claim 1, wherein
the semiconductor device is a semiconductor laser device.

8. The semiconductor device according to claim 1, further comprising:
a substrate, wherein
the mesa portion, the extending portion and the insulating portions are disposed on the substrate, and
the substrate is exposed by the gap.

9. The semiconductor device according to claim 8, wherein the substrate is completely exposed in the trench grooves.

10. The semiconductor device according to claim 1, wherein the wiring portion completely covers a top surface of the at least one of the insulation portions.

* * * * *